(12) United States Patent
Chen et al.

(10) Patent No.: US 11,582,865 B2
(45) Date of Patent: Feb. 14, 2023

(54) PACKAGE DEVICE

(71) Applicant: InnoLux Corporation, Miao-Li County (TW)

(72) Inventors: Yeong-E Chen, Miao-Li County (TW); Cheng-En Cheng, Miao-Li County (TW); Yu-Ting Liu, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 17/313,006

(22) Filed: May 6, 2021

(65) Prior Publication Data

US 2022/0167495 A1 May 26, 2022

(30) Foreign Application Priority Data

Nov. 26, 2020 (CN) .......................... 202011353828.7

(51) Int. Cl.
| | |
|---|---|
| *H05K 3/22* | (2006.01) |
| *H05K 3/24* | (2006.01) |
| *H05K 3/46* | (2006.01) |
| *H01L 21/48* | (2006.01) |
| *H01L 21/56* | (2006.01) |
| *H01L 21/60* | (2006.01) |
| *H01L 21/66* | (2006.01) |
| *H01L 23/31* | (2006.01) |
| *H01L 23/485* | (2006.01) |

(Continued)

(52) U.S. Cl.
CPC ............ *H05K 1/0269* (2013.01); *H05K 3/022* (2013.01); *H05K 3/46* (2013.01)

(58) Field of Classification Search
CPC ........ H05K 1/0269; H05K 3/022; H05K 3/24; H05K 3/46; H05K 3/242; H05K 3/243; H01L 21/48; H01L 21/56; H01L 21/60; H01L 21/66; H01L 21/568; H01L 21/4846; H01L 21/4857; H01L 23/31; H01L 23/485; H01L 24/03; H01L 24/05; H01L 24/11; H01L 24/13; H01L 24/96
USPC ........... 174/260; 428/206; 438/17, 106, 118, 438/613; 257/737
See application file for complete search history.

(56) References Cited

U.S. PATENT DOCUMENTS

2004/0209395 A1* 10/2004 Yang ...................... H05K 3/243
                                                                   438/106
2010/0071943 A1   3/2010 Tsai
(Continued)

FOREIGN PATENT DOCUMENTS

TW            201013856            4/2010

OTHER PUBLICATIONS

Chen, the specification, including the claims, and drawings in the U.S. Appl. No. 17/114,507 , filed Dec. 8, 2020.

*Primary Examiner* — Xiaoliang Chen
(74) *Attorney, Agent, or Firm* — Winston Hsu

(57) ABSTRACT

A package device and a manufacturing method thereof are provided. The package device includes a redistribution layer including a first dielectric layer, a conductive layer, and a second dielectric layer. The conductive layer is disposed between the first dielectric layer and the second dielectric layer. The redistribution layer has a test mark, the test mark includes a plurality of conductive patterns formed of the conductive layer, and the conductive patterns are arranged in a ring shape.

14 Claims, 10 Drawing Sheets

(51) Int. Cl.
*H05K 1/02* (2006.01)
*H05K 3/02* (2006.01)

(56) References Cited

U.S. PATENT DOCUMENTS

| | | | |
|---|---|---|---|
| 2010/0151629 A1* | 6/2010 | Oda | H01L 24/03 438/118 |
| 2011/0198748 A1* | 8/2011 | Koike | H01L 23/53238 257/E21.531 |
| 2012/0088078 A1* | 4/2012 | Owa | G03F 7/20 216/24 |
| 2018/0006381 A1* | 1/2018 | Hong | B32B 5/024 |
| 2022/0157680 A1* | 5/2022 | Shanmugam | H01L 23/49816 |

\* cited by examiner

PACKAGE DEVICE

CROSS REFERENCE TO RELATED APPLICATION

This application claims the benefit of Chinese Patent Application Serial No. 202011353828.7, filed Nov. 26, 2020, the entire content of which is incorporated herein by reference.

BACKGROUND OF THE DISCLOSURE

1. Field of the Disclosure

The present disclosure relates to a package device and a manufacturing method thereof, and more particularly to a package device having a test mark and a manufacturing method thereof.

2. Description of the Prior Art

In packaging technology, plural package devices may be produced by performing a redistribution layer process on a carrier. However, during the manufacturing processes, different or mismatched coefficients of thermal expansion (CTE) may exist between carrier and layers of a redistribution layer or between different layers of the redistribution layer formed on the carrier while process temperature changes, which results in serious warpage of the formed layers. Warpage degrees of different parts of the redistribution layer may be different, such that qualities of the package devices are not equal, or machines may not accomplish remaining processes due to the warpage of the redistribution layer. Also, currently, there is no way to inline inspecting processes of the redistribution layer, so that the warpage degrees or warpage tendency of the formed layers cannot be determined in real time, thereby affecting process yields.

SUMMARY OF THE DISCLOSURE

According to an embodiment of the present disclosure, a package device is provided and includes a redistribution layer. The redistribution layer includes a first dielectric layer, a conductive layer, and a second dielectric layer, and the conductive layer is disposed between the first dielectric layer and the second dielectric layer, wherein the redistribution layer has a test mark, the test mark includes a plurality of conductive patterns formed of the conductive layer, and the plurality of conductive patterns are arranged in a ring shape.

According to another embodiment of the present disclosure, a package device is provided and includes a redistribution layer. The redistribution layer includes a first dielectric layer, a conductive layer, and a second dielectric layer, and the conductive layer is disposed between the first dielectric layer and the second dielectric layer, wherein the redistribution layer has a test mark, the test mark includes a conductive pattern formed of the conductive layer, the conductive pattern includes a center portion and a plurality of extension portions, and the plurality of extension portions are respectively connected to the center portion.

According to some embodiments of the present disclosure, a manufacturing method of a package device includes providing a carrier, and forming a redistribution layer on the carrier. The redistribution layer includes a first dielectric layer, a conductive layer, and a second dielectric layer, and the conductive layer is disposed between the first dielectric layer and the second dielectric layer. The redistribution layer has a test mark, the test mark includes a plurality of conductive patterns, the plurality of conductive patterns are formed of the conductive layer, and the plurality of conductive patterns are arranged in a ring shape.

These and other objectives of the present disclosure will no doubt become obvious to those of ordinary skill in the art after reading the following detailed description of the embodiment that is illustrated in the various figures and drawings.

DETAILED DESCRIPTION

Figure 1:
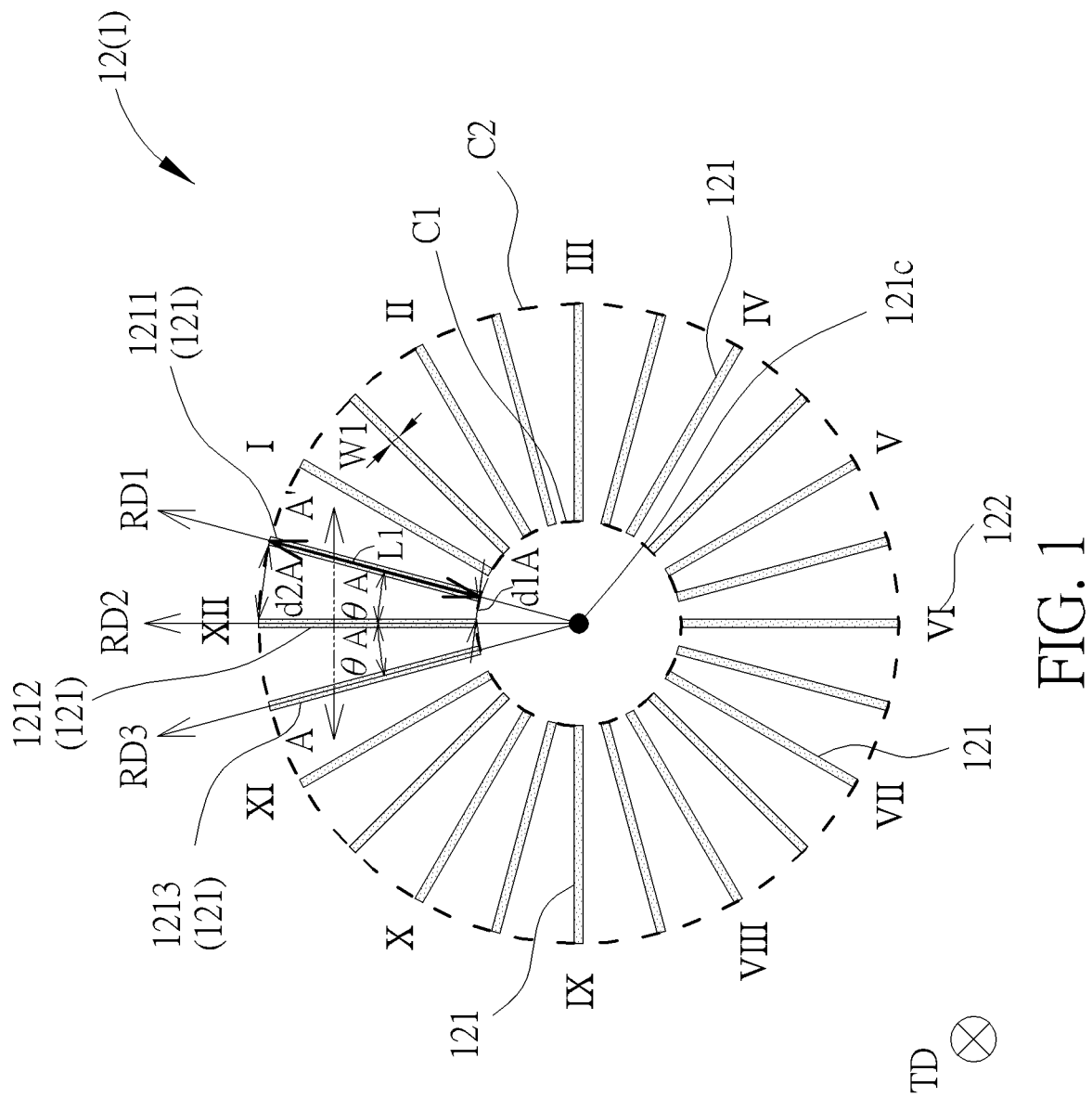
FIG. 1 schematically illustrates a top view of a test mark according to a first embodiment of the present disclosure.

Hereinafter, package devices of embodiments of the present disclosure are detailed in the following description. It should be understood that many different embodiments provided below are implemented to different aspects. The following specific components and arrangements describe some embodiments just for simplicity and clarity. Of course, these are just for example and not for limitation. In addition, similar components may be labeled with similar and/or corresponding reference numerals indifferent embodiments for clarity of description. However, these similar reference numbers just describe some embodiments simply and clearly, and do not mean that there is any relationship between different embodiments and/or structures discussed herein.

When a first layer is located on or above a second layer, the first layer may be in direct contact with the second layer. Alternatively, one or more other layers may be spaced between them, and in such case, the first layer may not be in direct contact with the second layer.

The contents of the present disclosure will be described in detail with reference to specific embodiments and drawings. In order to make the contents clearer and easier to understand, the following drawings may be simplified schematic diagrams, and components therein may not be drawn to scale. The numbers and sizes of the components in the drawings are just illustrative, and are not intended to limit the scope of the present disclosure.

Certain terms are used throughout the specification and the appended claims of the present disclosure to refer to specific components. Those skilled in the art should understand that electronic equipment manufacturers may refer to a component by different names, and this document does not intend to distinguish between components that differ in name but not function. In the following description and claims, the terms "comprise", "include" and "have" are open-ended fashion, so they should be interpreted as "including but not limited to . . . ". It should also be understood that when a component is said to be "coupled" to another component (or a variant thereof), it may be directly connected to another component or indirectly connected (e.g., electrically connected) to another component through one or more components.

When ordinal numbers, such as "first" and "second", used in the specification and claims are used to modify components in the claims, they do not mean and represent that the claimed components have any previous ordinal numbers, nor do they represent the order of a claimed component and another claimed component, or the order of manufacturing methods. These ordinal numbers are just used to distinguish a claimed component with a certain name from another claimed component with the same name.

When a component (e.g., film or region) is called "on another component", it may be directly on the another component, or there may be other components in between. On the other hand, when a component is called "directly on another component", there is no component between them. In addition, when a component is called "on another component", there is an upper and lower relationship between the two components in a top view direction, and this component may be above or below the other component, and this upper and lower relationship depends on the orientation of the device.

In this document, the terms "about", "substantially" and "approximately" usually mean within 10%, 5%, 3%, 2%, 1% or 0.5% of a given value or range. The quantity given here is about the quantity, that is, without specifying "about", "substantially" and "approximately", the meanings of "about", "substantially" and "approximately" may still be implied. In addition, the term "range from a first value to a second value" means that the range includes the first value, the second value and other values between them.

It should be understood that according to the following embodiments, features of different embodiments may be replaced, recombined or mixed to constitute other embodiments without departing from the spirit of the present disclosure. As long as the features of the embodiments do not violate the inventive spirit or conflict with each other, they can be mixed and used at will.

In the present disclosure, the thicknesses, lengths and widths may be measured by optical microscope, in which the thicknesses may be measured from cross-sectional image obtained by electron microscope, but the present disclosure is not limited to this. In addition, any two values or directions used for comparison may have certain errors. If a first value is equal to a second value, it implies that there may be about 10% error between the first value and the second value; if a first direction is perpendicular to a second direction, an angle between the first direction and the second direction may range from 80 degrees to 100 degrees; and if the first direction is parallel to the second direction, the angle between the first direction and the second direction may range from 0 to 10 degrees.

Unless otherwise defined, all terms used herein (including technical and scientific terms) have the same meanings as those commonly understood by those skilled in the art to which the present disclosure belongs. It can be understood that these terms, such as those defined in commonly used dictionaries, should be interpreted as meanings consistent with the background or context of related technologies and the present disclosure, and should not be interpreted in an idealized or overly formal way, unless it is specifically defined in the embodiments of the present disclosure.

Figure 2:
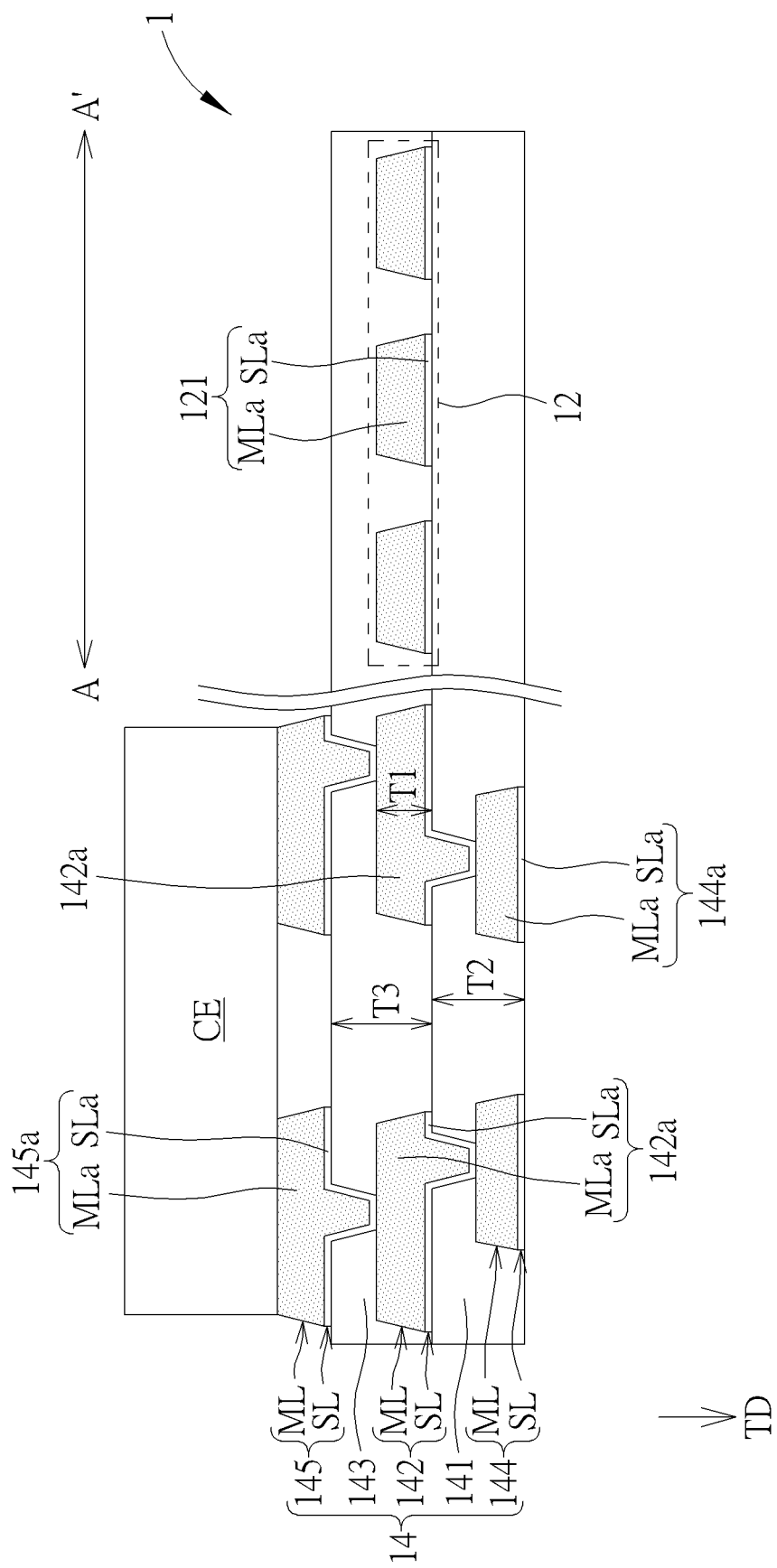
FIG. 2 schematically illustrates a cross-sectional view of a package device according to the first embodiment of the present disclosure.

FIG. 1 schematically illustrates a top view of a test mark according to a first embodiment of the present disclosure, and FIG. 2 schematically illustrates a cross-sectional view of a package device according to the first embodiment of the present disclosure, in which a right part of FIG. 2 schematically illustrates a cross-section view taken along a line A-A' shown in FIG. 1. For clearly illustrating the package device 1 of this embodiment, FIG. 2 shows a part of the cross-sectional structure, but the present disclosure is not limited thereto. As shown in FIG. 2, the package device 1 may include a redistribution layer 14, in which the redistribution layer 14 may have a test mark 12 for inspecting the warpage degree or warpage tendency of a carrier (e.g., a carrier 16 shown in FIG. 3) and layers of the redistribution layer 14 during processes for manufacturing the redistribution layer 14. In some embodiments, the package device may include an electronic component CE disposed on the redistribution layer 14. For example, the electronic component CE may include a chip, a passive component, or other suitable components, and is not limited herein. In some embodiments, the redistribution layer 14 may be a fan-out circuit structure formed on a wafer, for instance.

In the embodiment of FIG. 2, the redistribution layer 14 may include a first dielectric layer 141, a conductive layer 142, and a second dielectric layer 143, and the conductive layer 142 may be disposed between the first dielectric layer 141 and the second dielectric layer 143. For example, the conductive layer 142 may include a metal material, such as including copper (Cu), titanium (Ti), aluminum (Al), molybdenum (Mo), nickel (Ni), other suitable materials or any combination thereof, but the present disclosure is not limited thereto. A thickness T1 of the conductive layer 142 may, for example, range from 4 microns (µm) to 5 µm (4 µm≤the thickness T1≤5 µm), but not limited thereto. The first dielectric layer 141 and/or the second dielectric layer 143 may include photosensitive polyimide or other suitable dielectric materials, for example, but the present disclosure is not limited herein. A thickness T2 of the first dielectric layer 141 and/or a thickness T3 of the second dielectric layer 143 may, for example, range from 4 µm to 7 µm (4 µm≤the thickness T2≤7 µm; 4 µm≤the thickness T3≤7 µm), but not limited thereto. The thickness T1 of the conductive layer 142 may refer to as a maximum thickness of a part of the conductive layer 142 that does not extend into a through hole (e.g., a through hole 141a as mentioned in following contents) in a top view direction TD. The thickness T2 of the first dielectric layer 141 or the thickness T3 of the second dielectric layer 143 may refer to as a maximum thickness of a part of the dielectric layer which does not overlap the conductive layer covered by this dielectric layer in the top view direction TD, as shown in FIG. 1.

As shown in FIG. 1 and FIG. 2, the redistribution layer 14 may further include at least one trace 142a, in which the trace 142a is formed of the conductive layer 142, the test mark 12 may include a plurality of conductive patterns 121 formed of the conductive layer 142, and the plurality of conductive patterns 121 are arranged in a ring shape. The phrase of "the conductive patterns 121 are arranged in a ring shape" means that as viewed along the top view direction TD of the package device 1, the test mark 12 may have a center 121c (substantially corresponding to a center of the test mark 12), and these conductive patterns circle the center 121c and are arranged in the ring shape. In some embodiments, shapes of the conductive patterns may be substantially the same. In some embodiments, the trace 142a may be electrically connected to the electronic component CE disposed on the redistribution layer 14, for example, the trace 142a may be electrically connected to the electronic component CE through other conductive layers or conductive components. In some embodiments, the trace 142a may be electrically isolated from the test mark 12, but not limited thereto. In some embodiments, the conductive patterns 121 may, for example, be arranged outwardly in a radial shape with the center 121c as a center. For example, the conductive patterns 121 may include a conductive pattern 1211, a conductive pattern 1212, and a conductive pattern 123, and/or other conductive patterns (not labeled), which are arranged in the ring shape substantially around the center 121c in sequence. In some embodiments, the conductive patterns 121 may extend along different extending directions. For example, the conductive pattern 1211 may extend along an extending direction RD1, the conductive pattern 1212 may extend along an extending direction RD2, and the conductive pattern 1213 may extend along an extending direction RD3. The extending direction RD1, the extending direction RD2, and the extending direction RD3 may be different from each other, for example.

In FIG. 1, an angle θA may be between the extending directions of any two adjacent conductive patterns 121 of the conductive patterns 121, for example, and these angles θA may substantially the same, but not limited thereto. For example, an angle θA may be between the extending direction RD1 of the conductive pattern 1211 and the extending direction RD2 of the conductive pattern 1212, another angle θA may be between the extending direction RD2 of the conductive pattern 1212 and the extending direction RD3 of the conductive pattern 1213, and the angle θA may be substantially equal to the another angle θA, but not limited to this. In some embodiments, these angles θA may be, for example, range from 10 degrees to 45 degrees (10 degrees≤the angles θA≤45 degrees) or other suitable angle ranges, and the ranges of the angles θA may be adjusted according to the number of the conductive patterns 121 of one test mark 12, but not limited thereto. In other embodiments (not shown), the angle θA between the extending direction RD1 of the conductive pattern 1211 and the extending direction RD2 of the conductive pattern 1212 may be different from the angle θA between the extending direction RD2 of the conductive pattern 1212 and the extending direction RD3 of the conductive pattern 1213.

In the embodiment of FIG. 1, the conductive patterns 121 (e.g., the conductive pattern 1211, the conductive pattern 1212 and the conductive pattern 1213) are strip-shaped and have substantially the same width W1. The width W1 is defined as a maximum width of the conductive pattern 121 in a direction perpendicular to the extending direction of the conductive pattern 121 (e.g., the extending direction RD1, the extending direction RD2 or the extending direction RD3), but not limited thereto. In some embodiments, each of the conductive patterns 121 (e.g., the conductive pattern 1211, the conductive pattern 1212 and the conductive pattern 1213) may have a maximum width and a minimum width in a direction perpendicular to its extending direction, respectively, and a ratio of the maximum width to the minimum width may be range from 0.8 to 1.2 (0.8≤the ratio≤1.2). When the ratio of the maximum width to the minimum width is within the above range, it may consider that the conductive pattern with this ratio has substantially the same width W1, but not limited thereto. In the embodiment of FIG. 1, each of the conductive patterns (e.g., the conductive pattern 1211, the conductive pattern 1212 and the conductive pattern 1213) may have a length L1, which is defined as a maximum length of this conductive pattern 121 along the extending direction (e.g., extending direction RD1, extending direction RD2 or extending direction RD3) of this conductive pattern 121. In some embodiments, the lengths L1 of the conductive patterns 121 may optionally be designed to be the same or different, but not limited thereto.

In this embodiment, when the conductive layer 142 warps, the widths W1 of some of the conductive patterns 121 may have obvious changes or differences in different parts. For example, the ratio of the maximum width to the minimum width of one of the conductive patterns 121 may not be within the above range, so that the warping direction or warpage position may be determined by comparing the ratio of the maximum widths to the minimum widths of the conductive patterns 121 or comparing the maximum widths (or minimum widths) of different conductive patterns 121. Accordingly, the warpage degree or warpage tendency may be determined. The present disclosure is not limited herein. In this way, the process conditions may be improved or monitored in real time so as to improve the process yield.

In some embodiments, the conductive patterns (e.g., the conductive pattern 1211, the conductive pattern 1212, and the conductive pattern 1213) may have substantially the same shape and size, but not limited thereto. In some embodiments (not shown), the conductive patterns (the conductive pattern 1211, the conductive pattern 1212, and the conductive pattern 1213) may extend to the center 121c to be connected to each other, but not limited thereto. In other embodiments, the conductive patterns (the conductive pattern 1211, the conductive pattern 1212, and the conductive pattern 1213) may be adjusted to be wavy or other suitable shapes according to requirements, but not limited thereto.

In the embodiment of FIG. 1, a varying or uneven distance may be between adjacent two conductive patterns 121 (e.g., the conductive pattern 1211, the conductive pattern 1212, and the conductive pattern 1213). The distance may be defined as a distance (spacing) spaced between adjacent two conductive patterns. For example, in the embodiment of FIG. 1, the test mark 12 may have a center 121c, and the center 121c may optionally correspond to or not correspond to the conductive patterns 121. For example, the center 121c of FIG. may not correspond to the conductive patterns 121. In some embodiments, the distance between two adjacent conductive patterns 121 may increase, for example, in a direction away from the center 121c, but not limited thereto. In some embodiments (not shown), the distance between two adjacent conductive patterns 121 may decrease, for example, in the direction away from the center 121c. The above increase or decrease may not be limited to be increased or decreased proportionally. For example, a first distance d1A and a second distance d2A may be between adjacent two conductive patterns (e.g., the conductive pattern 1211, the conductive pattern 1212, and the conductive pattern 1213). The first distance d1A may be defined as a distance (spacing) between adjacent two conductive patterns located on a dotted line C1 closest to the center 121c, the second distance d2A may be defined as a distance (spacing) between adjacent two conductive patterns located on a dotted line C2 farthest from the center 121c, and the first distance d1A is greater than the second distance d2A, but not limited thereto. As shown in FIG. 1, the above-mentioned dotted line C1 is, for example, defined by short sides (not labeled) of the conductive patterns 121 (e.g., the conductive pattern 1211, the conductive pattern 1212, and the conductive pattern 1213, but not limited thereto) adjacent to the center 121c. The dotted line C2 is, for example, defined by other short sides of the conductive patterns 121 (e.g., the conductive pattern 1211, the conductive pattern 1212, and the conductive pattern 1213, but not limited thereto) away from the center 121c.

In some embodiments (as shown in FIG. 1), the test mark 12 may optionally include a plurality of sequence patterns 122 (including a number pattern, a letter pattern, a Roman numeral pattern or other sequence patterns) to mark orientations of the conductive patterns 121, but not limited thereto. For example, the sequence patterns 122 may be Roman numeral patterns I to XII, and each of these sequence patterns 122 may correspond to one conductive pattern, but not limited thereto. The arrangement of the sequence patterns 122 may, for example, be arranged in a clockwise or counterclockwise arrangement, but not limited thereto. In some embodiments, the number of the plural sequence patterns 122 may be adjusted according to the number of the plural conductive patterns 121. For example, the number of the plural conductive patterns 121 may be N1 times the number of the plural sequence patterns 122, and N1 is, for example, a positive integer.

It should be noted that, in the embodiment of FIG. 1, the conductive patterns 121 are designed to have substantially the same pattern with each other. For example, the conductive patterns 121 may have substantially the same shape, size, width, and/or length, and/or the adjacent conductive patterns 121 may have substantially the same angles θA, the same first distances d1A, and/or the same second distances d2A, but not limited thereto. In addition, when warpage of the conductive layer 142 occurs, at least a part of the conductive patterns 121 may be deformed. Since a plurality of conductive patterns 121 may be arranged in the ring shape, through identifying variation and/or position of the deformed conductive pattern 121, the warping direction and/or warpage position may be determined, thereby determining the warpage degree or warpage tendency of the conductive layer 142. For example, by comparing shapes, sizes, widths and/or lengths of different conductive patterns 121 with each other, and/or comparing the angles θA and/or distances between adjacent conductive patterns 121 (e.g., the first distance d1A and/or the second distance d2A) with each other, whether different parts of the conductive layer 142 are warped may be determined, or their warpage degree may be obtained, but not limited to thereto.

It should be noted that the redistribution layer 14 may include other layers according to requirements. In the embodiment of FIG. 2, the redistribution layer 14 may include a conductive layer 144 and/or a conductive layer 145. The conductive layer 144 is disposed under the first dielectric layer 141, and the conductive layer 145 is disposed on the second dielectric layer 143. For example, the conductive layer 144 may include at least one lower pad 144a disposed on a lower surface of the redistribution layer 14. The first dielectric layer 141 may have at least one through hole 141a, so that the trace 142a may be electrically connected to the lower pad 144a through the through hole 141a. The conductive layer 145 may include at least one upper pad 145a disposed on an upper surface of the redistribution layer 14, and the upper pad 145a may be used for electrical connection with external electronic components CE or other suitable components. The upper pad 145a may be electrically connected to the trace 142a through the through hole 143a of the second dielectric layer 143, and the trace 142a may be electrically connected to the lower pad 144a through the through hole 141a of the first dielectric layer 141. In some embodiments (not shown), the conductive layer 144 and/or the conductive layer 145 of the redistribution layer 14 may include at least one test mark to inspect the warpage degree while forming the conductive layer 144 and/or the conductive layer 145 in real time. The test mark of the conductive layer 144 and/or the conductive layer 145 may be applied to the test mark 12 of FIG. 1 and/or at least one of the test marks of the following embodiments and variant embodiments. In some embodiments, another conductive layer and/or another dielectric layer may be optionally disposed between the second dielectric layer 143 and the conductive layer 145 including the upper pad 145a. In some embodiments, other conductive layers and/or other dielectric layers may optionally be disposed between the first dielectric layer 141 and the conductive layer 144 including the lower pad 144a, but not limited thereto. In this case, the redistribution layer 14 may include other test marks formed of other conductive layers. In some embodiments, the test marks formed of different conductive layers may overlap or not overlap in the top view direction TD. In some embodiments, the number of the test marks 12 corresponding to one conductive layer may not be limited to one shown in FIG. 1, but may also be plural.

In some embodiments, as shown in FIG. 2, the conductive layer 142, the conductive layer 144 and/or the conductive layer 145 may be, for example, a single-layer structure or a multi-layer structure. For example, the multi-layer structure may include a seed layer SL and a metal layer ML stacked in sequence, but not limited thereto. In this case, the conductive pattern 121, the lower pad 144a, the trace 142a, and the upper pad 145a may respectively include a seed block SLa and/or a metal block MLa, but not limited thereto. In some embodiments, the conductive layer 142, the conductive layer 144, and the conductive layer 145 may, for example, include copper (Cu), titanium (Ti), aluminum (Al), molybdenum (Mo), nickel (Ni), other metal materials, or any combination thereof, but not limited thereto. Each of the thickness (not labeled) of the conductive layer 144 and the thickness (not labeled) of the conductive layer 145 may, for example, be equal to or different from the thickness T1 of the conductive layer 142 described above.

Figure 3:
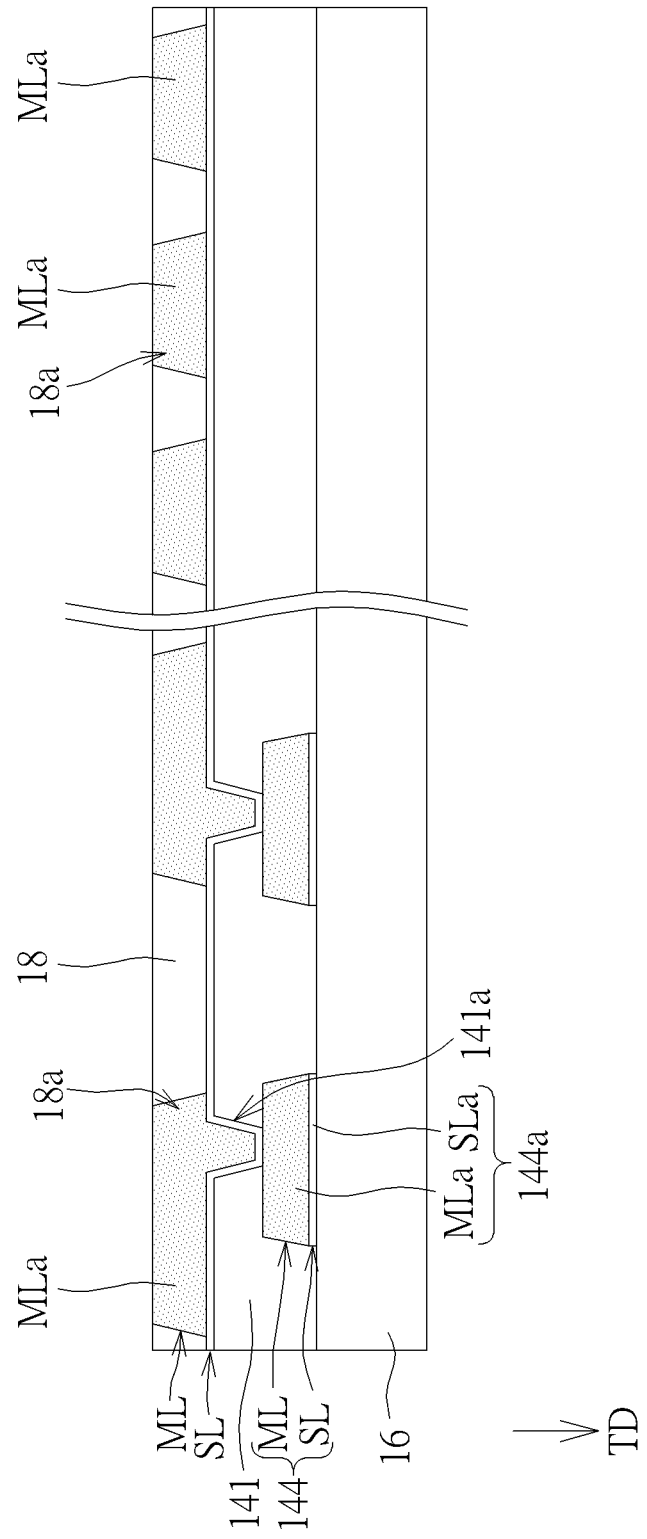
FIG. 3 schematically illustrates the manufacturing method of the package device according to the first embodiment of the present disclosure.

The following description further details the manufacturing method of the package device of this embodiment. The manufacturing method of the package device of some embodiments of the present disclosure may include providing the carrier 16, and forming the redistribution layer 14 on the carrier 16, in which the redistribution layer 14 may include the first dielectric layer 141, the conductive layer 142, and the second dielectric layer 143. The conductive layer 142 is disposed between the first dielectric layer 141 and the second dielectric layer 143, in which the redistribution layer 14 may have the test mark 12, and the test mark 12 may include a plurality of or at least one conductive pattern 121, and the conductive pattern 121 may be formed of the conductive layer 142. In some embodiments, the plurality of conductive patterns 121 may be arranged in the ring shape, but not limited thereto. For details, refer to FIG. 3 in combination with FIG. 2. FIG. 3 schematically illustrates the manufacturing method of the package device according to the first embodiment of the present disclosure.

First, as shown in FIG. 3, the carrier 16 is provided. Then, the conductive layer 144 including the lower pad 144a is formed on the carrier 16, and the first dielectric layer 141 is formed on the conductive layer 144 and the carrier 16. Subsequently, the through hole 141a is formed in the first dielectric layer 141 to expose at least a part of the lower pad 144a. Next, the seed layer SL is formed on the first dielectric layer 141, and the seed layer SL may extend into the through hole 141a. Thereafter, through an exposure and development process, a photoresist pattern 18 may be formed on the seed layer SL. The photoresist pattern 18 may have a plurality of through holes 18a to expose parts of the seed layer SL, and the metal block MLa may be subsequently disposed or filled in these through holes 18a; that is, the regions of the through holes 18a may substantially define positions of parts of the conductive layer 142. The formed metal layer ML may include a plurality of metal blocks MLa. For example, the method of forming the metal layer ML may include forming the metal layer ML on the exposed parts of the seed layer SL through an electroplating process, a chemical plating process, a physical vapor deposition process or other suitable processes.

As shown in FIG. 2, after the metal layer ML is formed, the photoresist pattern 18 may be removed to expose parts of the seed layer SL. Then, through an etching process, the parts of the seed layer SL that are uncovered by the metal layer ML may be removed to form a plurality of seed blocks SLa, thereby forming the conductive layer 142 on the first dielectric layer 141, but not limited thereto. After the test mark 12 is formed, an inspection step may be performed to obtain a top view image of the test mark 12 so as to determine whether the warpage occurs or whether the warpage degree exceed standard. The top view image of the test mark 12 may be obtained by, for example, an optical microscope, but not limited thereto. Through inspecting the conductive layer 142 in real time, the warpage degree and warpage tendency may be found in real time, so as to improve the process conditions in real time and/or increase the process yield.

As shown in FIG. 2, after the conductive layer 142 is formed, the second dielectric layer 143 may be formed on the conductive layer 142 and the first dielectric layer 141. In some embodiments, the second dielectric layer 143 may be optionally disposed on the test mark 12, but not limited thereto.

As shown in FIG. 2, after the second dielectric layer 143 is formed, the conductive layer 145 may be formed on the second dielectric layer 143, thereby forming the redistribution layer 14 on the carrier 16. Then, the carrier 16 may be optionally removed to form the package device 1 of this embodiment. In some embodiments, a plurality of package devices 1 may be formed on the carrier 16, so that before or after the carrier 16 is removed, a cutting process may be performed to separate the package devices 1 from each other, but not limited thereto. In some embodiments, the method of forming at least one of the conductive layer 144 and the conductive layer 145 may be similar to the method of forming the conductive layer 142, but not limited thereto. In some embodiments, after the conductive layer 144 and/or the conductive layer 145 is formed, another inspection step may be performed to inspect the warpage degrees during the formation of the conductive layer 144 and/or the conductive layer 145, but not limited thereto.

The test mark of the present disclosure is not limited to the above-mentioned embodiment and may include different embodiments or variant embodiments. In order to simplify the description, different embodiments and variant embodiments described below will refer to components identical to those in the first embodiment using the same labels. For clearly describing different embodiments and variant embodiments, the following contents will describe differences between the first embodiment and different embodiments or variant embodiments, and will no longer repeat descriptions regarding the same components in detail.

Figure 4:
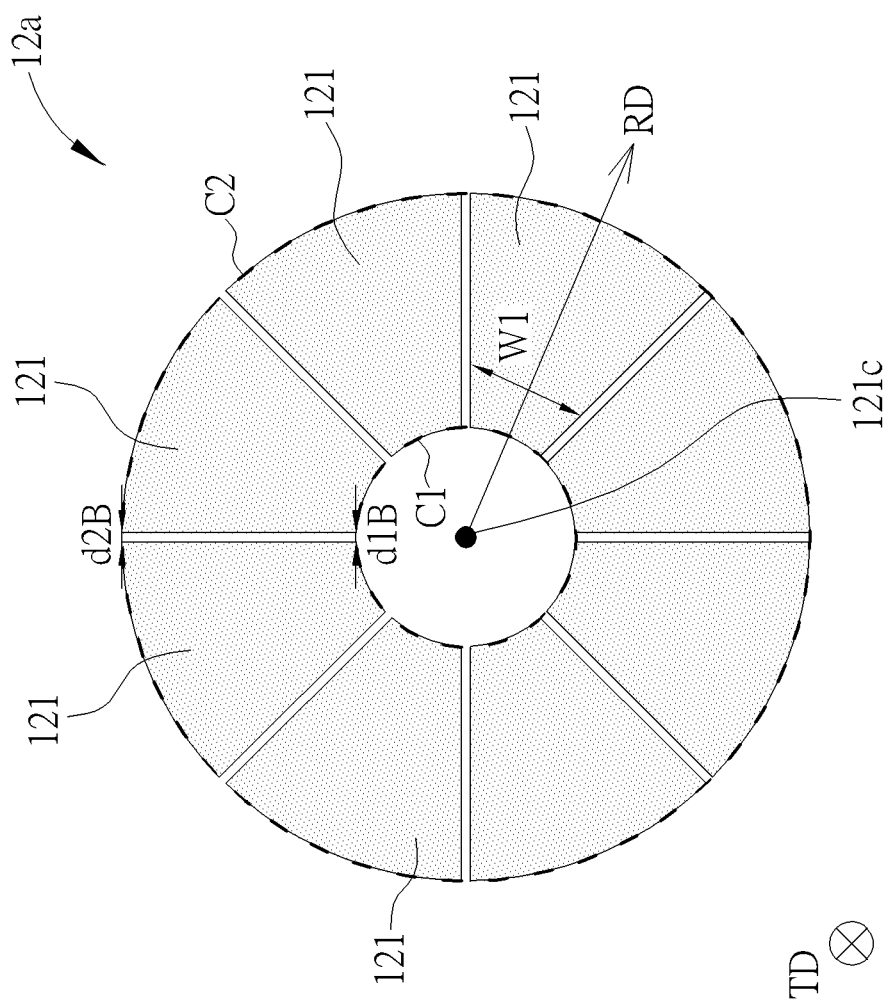
FIG. 4 schematically illustrates a test mark according to a variant embodiment of the first embodiment of the present disclosure.
Figure 7:
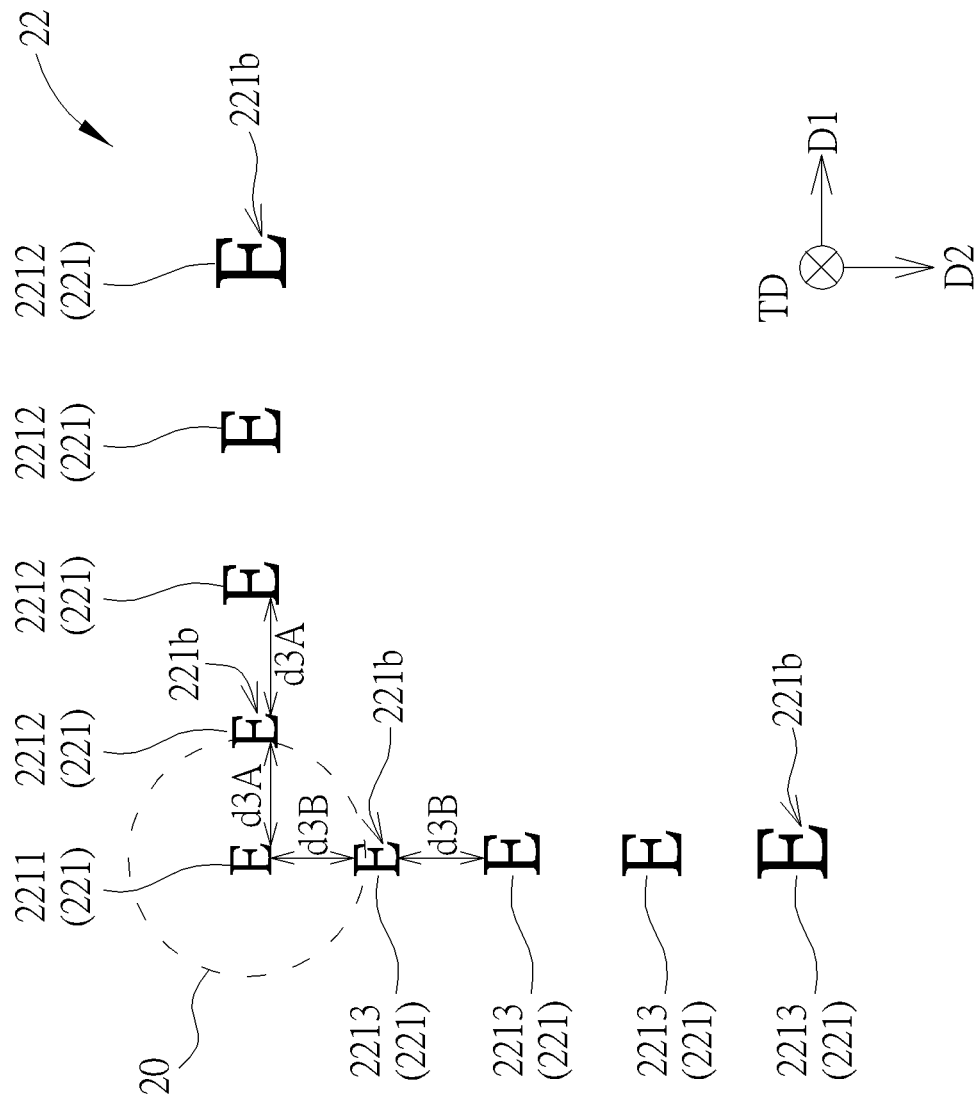
FIG. 7 schematically illustrates a top view of the test mark of a second embodiment of the present disclosure.

FIG. 4 schematically illustrates a test mark according to a variant embodiment of the first embodiment of the present disclosure. As shown in FIG. 4, the test mark 12a may have a plurality of conductive patterns 121, and a uniform distance may be between two adjacent conductive patterns 121. In some embodiments, a first distance d1B and a second distance d2B may be between adjacent two conductive patterns 121. The first distance d1B may be defined as a distance (spacing) between adjacent two conductive patterns 121 on the dotted line C1 closest to the center 121c, the second distance d2B may be defined as a distance (spacing) between adjacent two conductive patterns 121 on the dotted line C2 furthest away from the center 121c, and the first distance d1B is substantially equal to the second distance d2B, but not limited thereto. As shown in FIG. 4, the above-mentioned dotted line C1 may be, for example, defined by the short sides (not labeled) of the conductive patterns 121 adjacent to the center 121c, and the above-mentioned dotted line C2 may be, for example, defined by other short sides (not labeled) of the conductive patterns 121 away from the center 121c. The test mark 12a may have the center 121c, and the center 121c may optionally correspond to or not correspond to the conductive patterns 121. For example, the center 121c of the embodiment of FIG. 4 may not correspond to the conductive patterns 121. In this variant embodiment, the warpage degree or the warpage tendency of the conductive layer may be determined by comparing the first distances d1B and/or the second distances d2B between adjacent conductive patterns 121 or comparing the first distances d1B and/or the second distances d2B with design standards. In some embodiments (as shown in FIG. 7), the top-view shape of each of the conductive patterns 121 of the test mark 12a may be an annular sector pattern or other patterns whose width increases along its extending direction, but not limited thereto. For example, the width W1 of the conductive pattern 121 may gradually increase along a direction away from the center 121c, and the width W1 of the conductive pattern 121 may be, for example, a width measured in a direction perpendicular to the extending direction RD of the conductive pattern 121. In some embodiments (not shown), the width W1 of the conductive pattern 121 may also gradually decrease along a direction away from the center 121c. The increase or decrease mentioned above may not be limited to be increased or decreased proportionally. Other parts of the test mark 12a and the manufacturing method of the test mark 12a of this variant embodiment may be the same as or similar to the above-mentioned embodiment and will not be repeated in detail.

Figure 5:
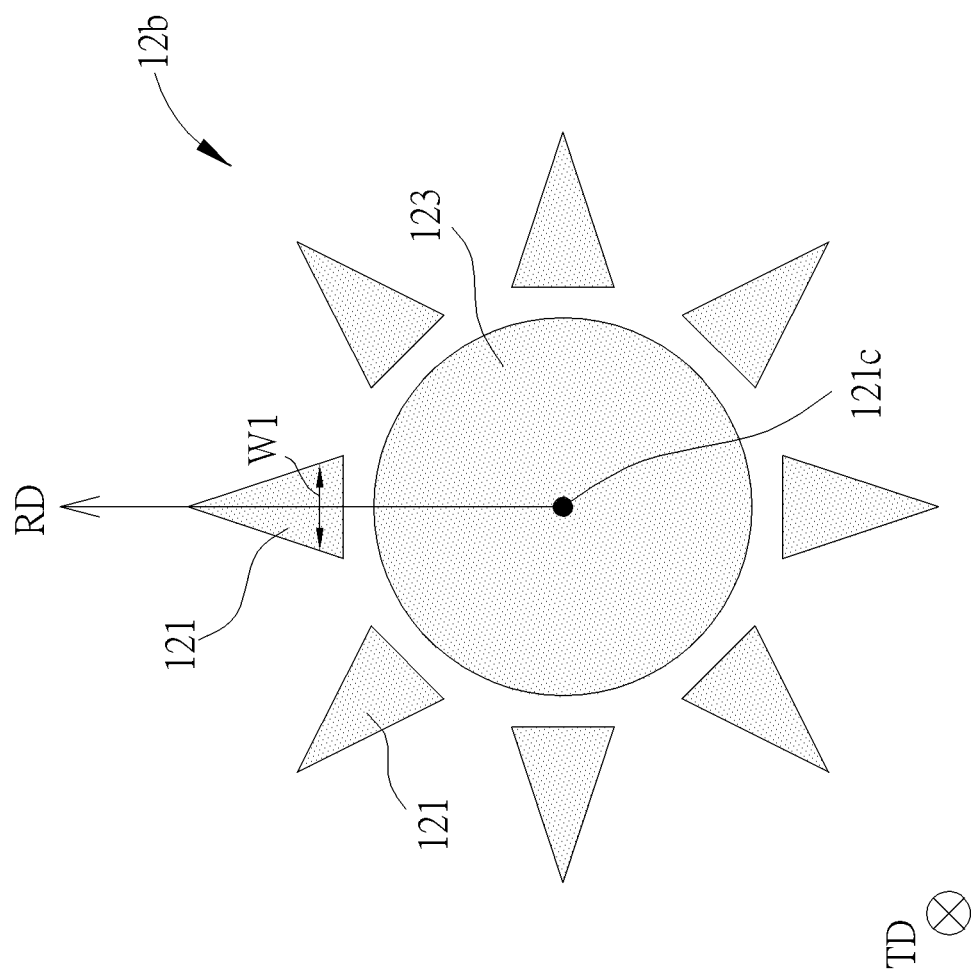
FIG. 5 schematically illustrates a top view of a test mark according to another variant embodiment of the first embodiment of the present disclosure.

FIG. 5 schematically illustrates a top view of a test mark according to another variant embodiment of the first embodiment of the present disclosure. As shown in FIG. 5, the test mark 12b may have a plurality of conductive patterns 121. The width W1 of each of the conductive patterns 121 may gradually decrease along a direction away from the center 121c. The width W1 may be, for example, a width measured in a direction perpendicular to the extension direction RD of the conductive pattern 121, and the conductive patterns 121 may have substantially the same size, but not limited thereto. In some embodiments, the test mark 12b may have a center 121c, and the center 121c may or may not correspond to the conductive patterns 121. In the embodiment of FIG. 5, the center 121c may, for example, correspond to the conductive patterns 121. For example, at least one of the plurality of conductive patterns 121 may be triangular (e.g., isosceles triangle) or other suitable shapes, but is not limited thereto. In this variant embodiment, the warpage degree or the warpage tendency of the conductive layer may be determined by comparing the sizes of these conductive patterns 121 or comparing the sizes of the detected conductive patterns 121 with the design standards. In some embodiments, the test mark 12b may include a plurality of conductive patterns 121 and another conductive pattern 123. The plurality of conductive patterns 121 are arranged around the another conductive pattern 123, and the conductive patterns 121 and the other conductive pattern 123 may, for example, be formed of the same conductive layer (e.g., the conductive layer 142). In some embodiments, a shape of the another conductive pattern 123 may include circle or other suitable shapes. In some embodiments, minimum distances from these conductive patterns 121 to the another conductive pattern 123 may be substantially the same, so that the warpage degree or warpage tendency of the conductive layer may be determined by comparing the minimum distances between the conductive patterns 121 and the conductive pattern 123 with each other or comparing these minimum distances with the design standards. The other parts of the test mark 12b and the manufacturing method of the test mark 12b of this variant embodiment may be the same as or similar to the above-mentioned embodiment and may refer to the description of the above-mentioned embodiment, so that they will not be repeated.

Figure 6:
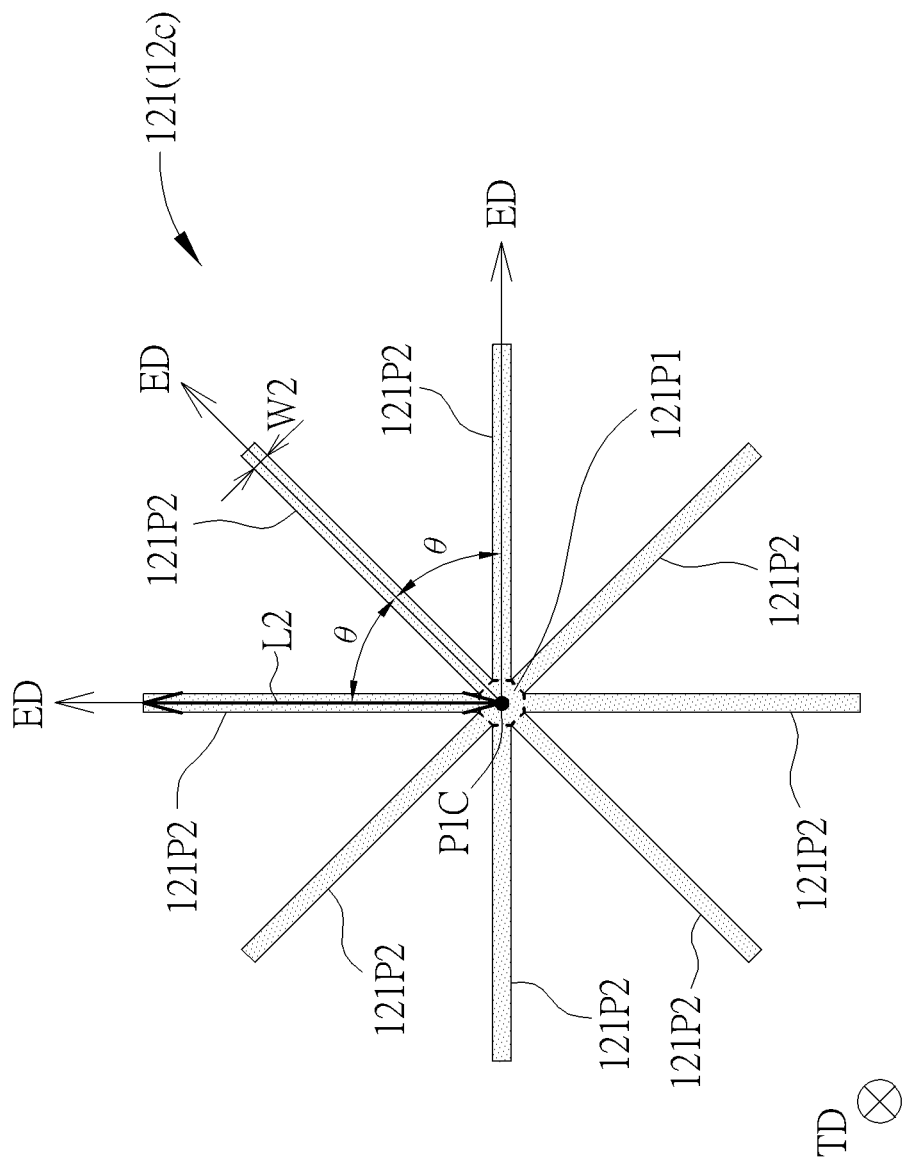
FIG. 6 schematically illustrates a top view of a test mark according to another variant embodiment of the first embodiment of the present disclosure.

FIG. 6 schematically illustrates a top view of a test mark according to another variant embodiment of the first embodiment of the present disclosure. As shown in FIG. 6, the test mark 12c may include a conductive pattern 121 formed of the conductive layer 124 as described above. The conductive pattern 121 may include a center portion 121P1 and a plurality of extension portions 121P2, and the plurality of extension portions 121P2 may be respectively connected to the center portion 121P1. For example, the extension portions 121P2 may be separated from each other and connected to each other by the center portion 121P1. In some embodiments, the plurality of extension portions 121P2 may extend outwardly in the radial shape with the center portion 121P1 substantially as a center, but not limited thereto. For example, the extension portions 121P2 extend outwardly in the radial shape with a center point P1C of the center portion 121P1 substantially as the center. As viewed along the top view direction TD, an angle θ may be between the extension directions ED of any two adjacent extension portions 121P2, and these angles θ may be substantially the same. In some embodiments, these angles θ may range from 10 degrees to 45 degrees (10 degrees≤the angles θ≤45 degrees), but not limited thereto. The angles θ may be adjusted according to the number or width W2 of the extension portions 121P2. In some variant embodiments, the warpage degree or warpage tendency of the conductive layer may be determined by comparing the angles θ between the conductive patterns 121 or comparing the detected angles θ with the design standards. In the embodiment of FIG. 6, the extension portions 121P2 may respectively have the extension directions ED, and each of the extension portions 121P2 may have a uniform width W2 in a direction perpendicular to its extension direction ED, but not limited thereto. In some embodiments, a distance L2 may be between the short side of each of the extension portions 121P2 away from the center portion 121P1 and the center point P1C in the extension direction ED of the extension portion 121P2, and the distances L2 may be substantially the same or at least two of the distance L2 may be different. Alternatively, the widths W2 of at least two extension portions 121P2 may be different. The other parts of the test mark 12c and the manufacturing method of the test mark 12c of this variant embodiment may be the same as or similar to the above-mentioned embodiment and will not be repeated.

FIG. 7 schematically illustrates a top view of the test mark of a second embodiment of the present disclosure. As shown in FIG. 7, the test mark 22 may include a plurality of conductive patterns 221, and these conductive patterns 221 may have substantially similar top-view shapes. The conductive patterns 221 may be arranged along at least one direction or arranged along multiple directions, for example, along the direction D1 and/or the direction D2. The direction D1 may be different from the direction D2, and the direction D1 may be, for example, perpendicular to the direction D2, but not limited thereto. In some embodiments, the sizes of the plurality of conductive patterns 221 may sequentially increases or decreases, for example, along the at least one direction. It should be noted that the above-mentioned sequential increase or decrease may not mean that the sizes need to be changed proportionally. In some embodiments, the top-view shapes of the conductive patterns 121 may be, for example, an E-shape, a C-shape, or other suitable shapes with notches.

For example, in the embodiment of FIG. 7, the conductive patterns 221 may include a conductive pattern 2211, a plurality of conductive patterns 2212, and a plurality of conductive patterns 2213. In some embodiments, the conductive patterns 221 may include a conductive pattern 2211 and a plurality of conductive patterns 2212, or a conductive pattern 2211 and a plurality of conductive patterns 2213. As shown in FIG. 7, the conductive pattern 2211 and the plurality of conductive patterns 2212 may be arranged, for example, along the direction D1, and the sizes of the conductive pattern 2211 and the plurality of conductive patterns 2212 may be sequentially increased or decreased along the direction D1, in which a distance d3A may be between any two adjacent conductive patterns 221 arranged in sequence, and the distances d3A may be substantially the same, but not limited thereto. The conductive pattern 2211 and the plurality of conductive patterns 2213 may be arranged, for example, along the direction D2, and the sizes of the conductive pattern 2211 and the plurality of conductive patterns 2213 may be sequentially increased or decreased along the direction D2, in which a distance d3B may be between any two adjacent conductive patterns sequentially arranged along the direction D2, and the distances d3B may be substantially the same, but not limited thereto. In this case, the distance d3A between two adjacent conductive patterns 221 sequentially arranged along the direction D1 may be substantially equal to the distance d3B between two adjacent conductive patterns 221 sequentially arranged along the direction D2, but not limited thereto. It may be determined whether the warpage of the conductive layer occurs or the warpage degree of the conductive layer may be obtained by inspecting the distances, sizes, or pattern shape of the conductive patterns 221. For example, the test mark 22 may have a center (e.g., substantially corresponding to the conductive pattern 2211), and a plurality of virtual circles 20 (FIG. 7 just shows one of the virtual circles for illustration) may be illustrated from the center (e.g., substantially corresponding to the conductive pattern 2211). The virtual circles may cross both one of the conductive patterns 2212 and one of the conductive patterns 2213. By inspecting the size of the conductive pattern 2212 and the size of the conductive pattern 2213 corresponding to the same virtual circle 20, and/or the distance d3A between this conductive pattern 2212 and the conductive pattern 2211 and the distance d3B between this conductive pattern 2213 and the conductive pattern 2211 corresponding to the same virtual circle 20, it may be determined whether the warpage occurs or how much the warpage degree is. In some embodiments, the center may not correspond to the conductive patterns 221. In some embodiments, at least two distances d3A of the conductive patterns 221 sequentially arranged along the direction D1 may not be the same, and/or at least two pitches d3B of the conductive patterns 221 sequentially arranged along the direction D2 may also not be the same.

In the embodiment shown in FIG. 7, each of the conductive patterns 221 may include at least one notch 221b. Since the sizes of the conductive patterns 221 (e.g., widths of the notches 221b) may increase or decrease along the direction D1 and/or the direction D2, For example, sizes of the notches 221b of the conductive pattern 2211 and the conductive pattern 2212 may sequentially increase or decrease along the direction D1, and sizes of the notches 221b of the conductive pattern 2211 and the conductive pattern 2213 may sequentially increase or decrease along the direction D2, but not limited thereto. The warpage of the conductive layer may also be determined by inspecting the sizes of the notches 221b of different conductive patterns 221.

Figure 8:
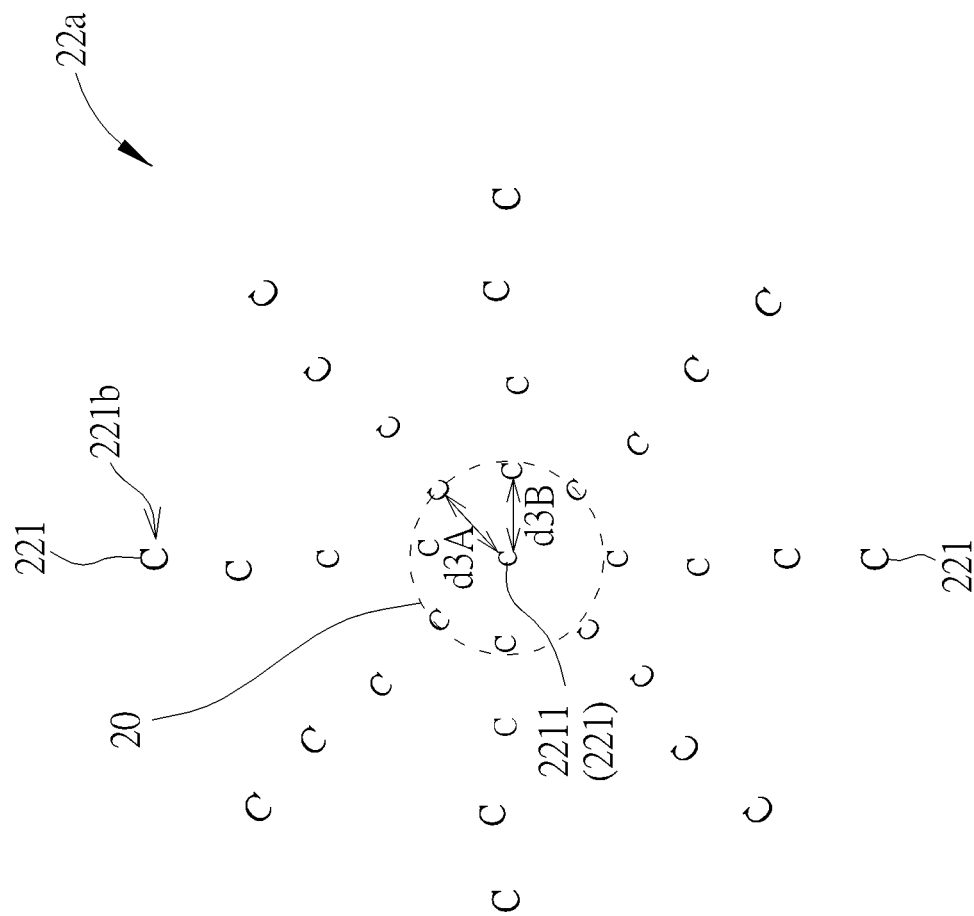
FIG. 8 schematically illustrates a top view of a test mark according to a variant embodiment of the second embodiment of the disclosure.

FIG. 8 schematically illustrates a top view of a test mark according to a variant embodiment of the second embodiment of the disclosure. As shown in FIG. 8, in this variant embodiment, the test mark 22a may have a plurality of conductive patterns 221, and the plurality of conductive patterns 221 may be arranged in a ring shape. In some embodiments, the plurality of conductive patterns 221 may be arranged in a radial shape, but not limited thereto. In the embodiment of FIG. 8, top-view shapes of the conductive patterns 221 may be C-shaped as an example, but not limited thereto. The top-view shapes of the conductive patterns 221 may also be E-shaped or other suitable shapes. The conductive patterns 221 may be arranged in a star shape or other suitable shapes, for example. In some embodiments (not shown), the test mark 22a may not include the conductive pattern 2211 substantially located at the center of the virtual circle 20, or the center of the test mark 22a may not correspond to any conductive pattern 221. Through inspecting the sizes of the conductive patterns 221 substantially corresponding to the same virtual circle 20 (FIG. 8 just shows one the virtual circle 20 for illustration) and/or the distances (e.g., the distance d3A and the distance d3B) from the conductive patterns 221 substantially located on the same virtual circle 20 to the center of the same virtual circle 20, it may be determined whether the warpage of the conductive layer occurs or how much the warpage degree of the conductive layer is. The conductive patterns 221 substantially corresponding to the same virtual circle 20 may, for example, mean that the conductive patterns 221 crossing the virtual circle 20 or substantially adjacent to the virtual circle 20.

Figure 9:
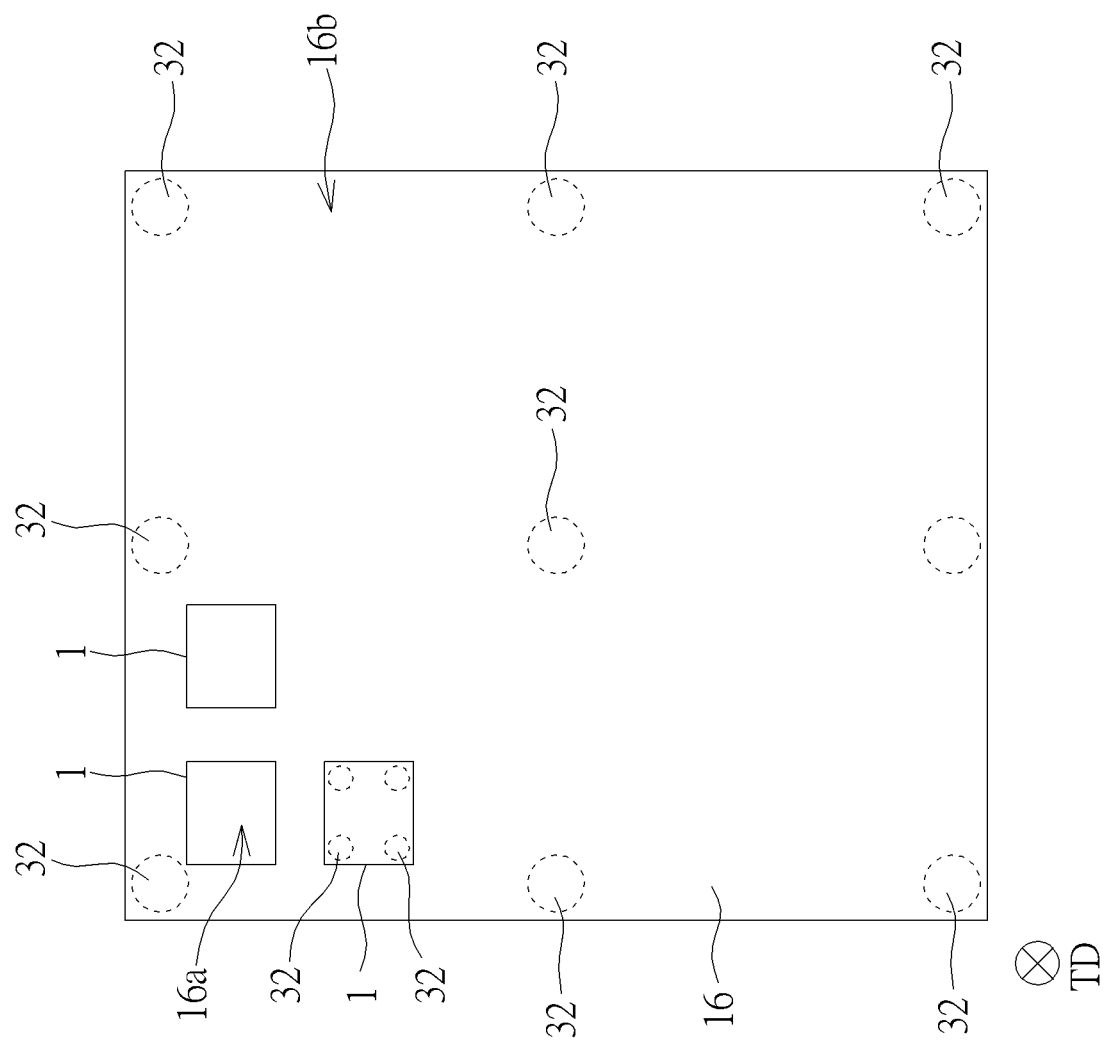
FIG. 9 schematically illustrates positions of the test marks according to an embodiment of the present disclosure.

FIG. 9 schematically illustrates positions of the test marks according to an embodiment of the present disclosure. As shown in FIG. 9, the carrier 16 may have a plurality of device regions 16a and a peripheral region 16b surrounding the plurality of device regions 16a, and one of the device regions 16a may correspond to one package device 1, but not limited thereto. The package device 1 of this embodiment may be, for example, the package device of any of the above-mentioned embodiments or variant embodiments, and the test mark 32 may be, for example, the test mark of any of the above-mentioned embodiments or variant embodiments. The redistribution layer 14 (not shown, may refer to FIG. 2 and FIG. 3) may be formed on the carrier 16 and may include a plurality of test marks 32, and at least one test mark 32 may be disposed on the carrier 16 in at least one of the device regions 16a and the peripheral region 16b. In some embodiments, when the test mark 32 is disposed on the carrier 16 in the peripheral region 16b, the test mark 32 may be located at a corner, a side, a center, and/or other portions of the peripheral region 16b, but not limited thereto. In some embodiments, when the test mark 32 is disposed on the carrier 16 in one of the device regions 16a, the test mark 32 may be located at a corner, a side and/or other portions of the device region 16a, but not limited thereto. By installing the test marks 32 on the carrier 16 in different regions, the warpage degree in different regions may be inspected.

In some embodiments, after the plural package devices 1 are completed, for example, after the redistribution layer 14 is completed in the device regions 16a, the peripheral region 16b may, for example, be removed, and the test marks 32 located on the carrier 16 in the peripheral region 16b may also be removed.

Figure 10:
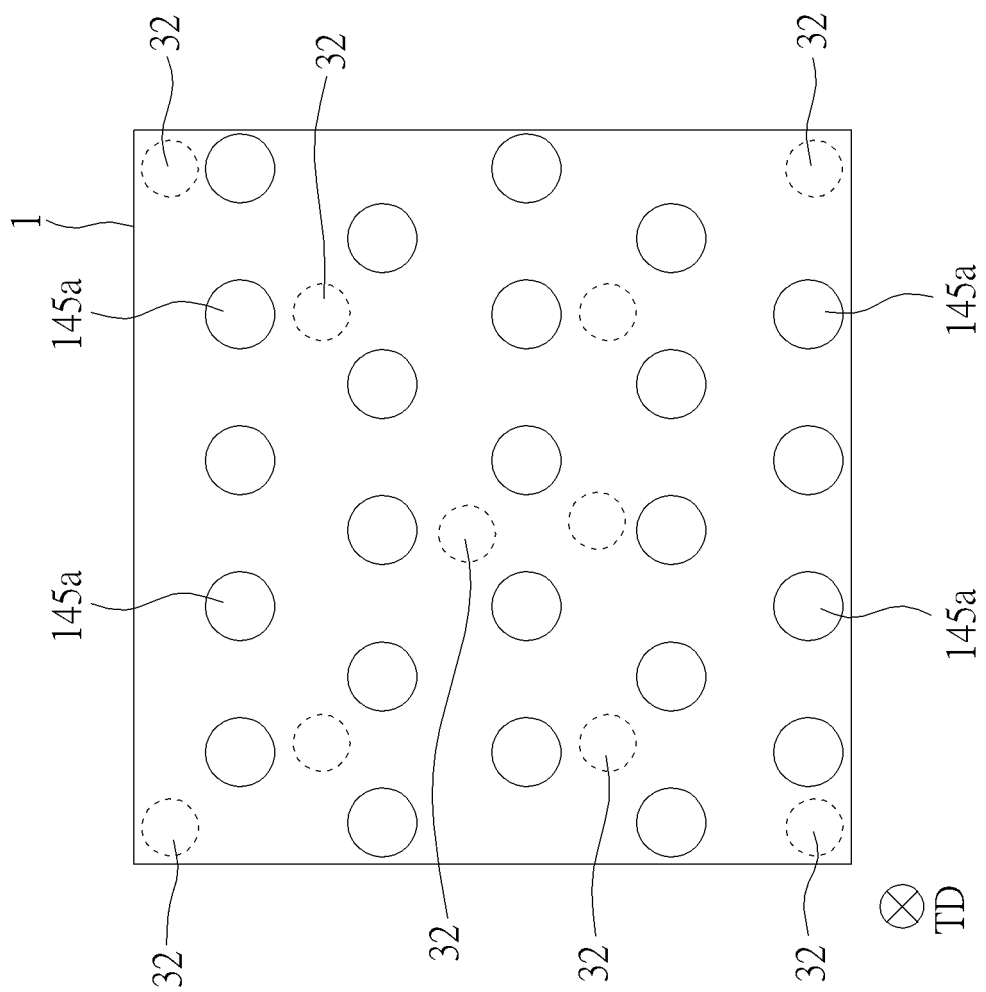
FIG. 10 schematically illustrates positions of test marks in the package device according to another embodiment of the present disclosure.

FIG. 10 schematically illustrates positions of test marks in the package device according to another embodiment of the present disclosure. As shown in FIG. 10, the test marks 32 may be dispersed at different positions of the package device 1. For example, at least one of the test marks 32 may be adjacent to one of the upper pads 145a and/or disposed at the corner of the package device 1. In some embodiments, the size of one of the test marks 32 may be less than or equal to that of one of the upper pads 145a, but not limited thereto. In other embodiments, the relationship between the sizes of the test marks 32 and sizes of the upper pads 145a may be designed according to requirements.

In summary, in the manufacturing method of the package device of the present disclosure, since the test marks are formed at the same time during the process of manufacturing the package device, the test marks may be identified to determine whether the warpage occurs or whether the warpage degree exceeds the standards in real time, thereby increasing the process yield.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A package device, comprising:
a redistribution layer comprising a first dielectric layer, a conductive layer, and a second dielectric layer, and the conductive layer being disposed between the first dielectric layer and the second dielectric layer, wherein the redistribution layer has a test mark, the test mark comprises a plurality of conductive patterns formed of the conductive layer, and the plurality of conductive patterns are arranged in a ring shape, wherein a plurality of the plurality of conductive patterns arranged along at least one direction, and sizes of the plurality of the plurality of conductive patterns sequentially increase along the at least one direction.

2. The package device according to claim 1, wherein the test mark further comprises another conductive pattern, and the plurality of conductive patterns surround the another conductive pattern, and the another conductive pattern is formed of the conductive layer.

3. The package device according to claim 1, wherein the test mark further comprises a plurality of sequence patterns, a number of the plurality of conductive patterns is N1 times a number of the plurality of sequence patterns, where N1 is a positive integer.

4. The package device according to claim 1, wherein the redistribution layer further comprises a trace, the trace is formed of the conductive layer, the trace is electrically connected to an electronic component disposed on the redistribution layer, and the trace is electrically isolated from the test mark.

5. The package device according to claim 1, wherein the conductive layer is a multi-layer structure, and the multi-layer structure comprises a seed layer and a metal layer sequentially stacked.

6. The package device according to claim 1, wherein the plurality of conductive patterns extend along different directions.

7. The package device according to claim 1, wherein a thickness of the conductive layer ranges from 4 μm to 5 μm.

8. The package device according to claim 1, wherein a thickness of the second dielectric layer ranges from 4 μm to 7 μm.

9. The package device according to claim 1, wherein each of the plurality of the plurality of conductive patterns comprises a notch, and widths of the notches sequentially increase along the at least one direction.

10. The package device according to claim 1, wherein an uneven distance is between adjacent two of the plurality of conductive patterns.

11. The package device according to claim 1, wherein a uniform distance is between adjacent two of the plurality of conductive patterns.

12. The package device according to claim 1, wherein the conductive layer comprises a metal material.

13. A package device, comprising:

a redistribution layer comprising a first dielectric layer, a conductive layer, and a second dielectric layer, and the conductive layer being disposed between the first dielectric layer and the second dielectric layer, wherein the redistribution layer has a test mark, the test mark comprises a plurality of conductive patterns formed of the conductive layer, and the plurality of conductive patterns are arranged in a ring shape, wherein the redistribution layer further comprising at least one upper pad disposed on the second dielectric layer, and a size of the test mark is less than a size of the at least one upper pad.

14. A package device, comprising:

a redistribution layer comprising a first dielectric layer, a conductive layer, and a second dielectric layer, and the conductive layer being disposed between the first dielectric layer and the second dielectric layer, wherein the redistribution layer has a test mark, the test mark comprises a plurality of conductive patterns formed of the conductive layer, and the plurality of conductive patterns are arranged in a ring shape, wherein the test mark has a center, and a width of one of the plurality of conductive patterns in a direction perpendicular to an extending direction of the one of the plurality of conductive patterns gradually decreases along a direction away from the center.

* * * * *